United States Patent [19]

Kawahara et al.

[11] Patent Number: 5,119,156
[45] Date of Patent: Jun. 2, 1992

[54] PHOTO-DETECTING SEMICONDUCTOR DEVICE WITH PASSIVATION SUPPRESSING MULTI-REFLECTIONS

[75] Inventors: Yukito Kawahara; Satoshi Machida; Hiroshi Mukainakano, all of Tokyo, Japan

[73] Assignee: Seiko Instruments Inc., Japan

[21] Appl. No.: 239,524

[22] Filed: Sep. 1, 1988

[30] Foreign Application Priority Data

Sep. 11, 1987 [JP] Japan .................. 62-228179

[51] Int. Cl.$^5$ .................. H01L 27/14; H01L 29/34
[52] U.S. Cl. .................. 357/30; 357/32; 357/52; 357/54
[58] Field of Search .................. 357/30, 52, 54, 32

[56] References Cited

U.S. PATENT DOCUMENTS 4,277,793  7/1981  Webb .................. 357/30
4,555,622 11/1985  Glass et al. .................. 357/30
4,665,422  5/1987  Hirao et al. .................. 357/30

FOREIGN PATENT DOCUMENTS 58-18972   2/1983  Japan .................. 357/30
60-88482   5/1985  Japan .................. 357/30
61-12065   1/1986  Japan .................. 357/30
61-154164  7/1986  Japan .................. 357/30

Primary Examiner—Jerome Jackson, Jr.
Attorney, Agent, or Firm—Bruce L. Adams; Van C. Wilks

[57] ABSTRACT

A photo-detecting element is covered with a passivation film having an uneven surface to avoid multi-reflection for the monochromatic incident light. The uneven film transmits the same intensity of incident light even if the mean thickness of uneven film is not constant over the entire surface of a semiconductor substrate.

4 Claims, 7 Drawing Sheets

PHOTO-DETECTING SEMICONDUCTOR DEVICE WITH PASSIVATION SUPPRESSING MULTI-REFLECTIONS

BACKGROUND OF THE INVENTION

1. Field of the Invention

The present invention relates to a semiconductor device for receiving reflected light from printed matter which is irradiated by a light source and converting the reflected light into an electric signal, and more specifically relates to a photo-detecting semiconductor device of a contact type having a light receiving portion positionable in contact with printed matter to directly read the same.

2. Prior Art

Figure 2:
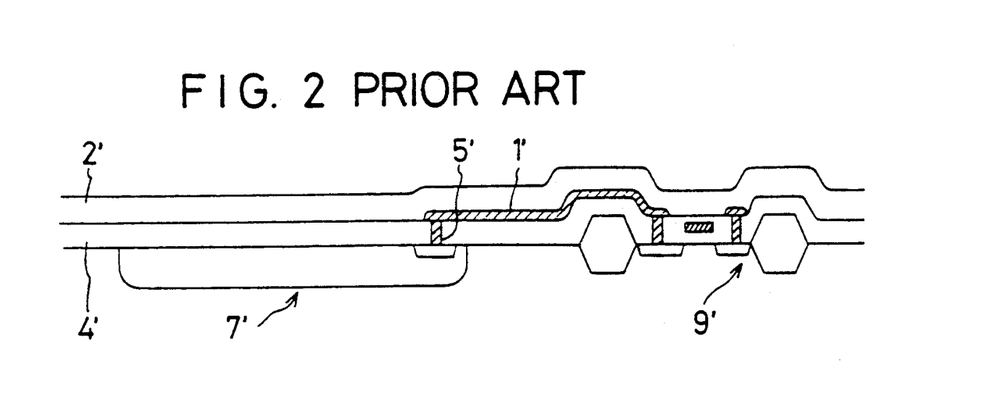
FIG. 2 is a sectional view of a conventional photo-detecting semiconductor device.

FIG. 2 shows a conventional photo-detecting semiconductor device comprised of a photo-detecting element 7' and a driving element 9' for selecting the corresponding photo-detecting element 7' and amplifying an electric signal produced in the photo-detecting element 7'. The photo-detecting element 7' and driving element 9' are formed on a common semiconductor substrate, and are covered with an outer passivation film 2' to protect the elements 7' and 9' from the environment. The elements 7' and 9' are covered with an inner passivation film 4' and are connected to each other through a contact hole 5' and a lead 1'.

Figure 3:
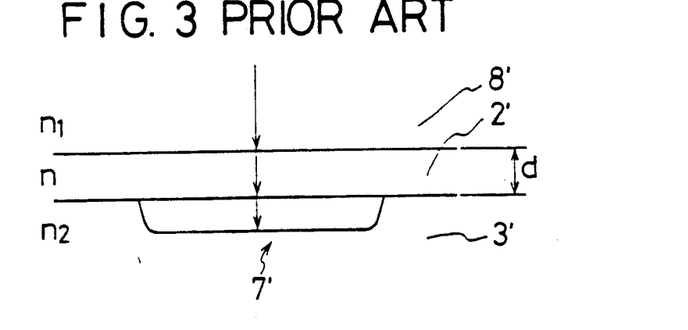
FIG. 3 is a sectional view of a conventional photo-detecting element.

FIG. 3 shows a sectional view of a conventional photo-detecting element 7' formed in a semiconductor substrate 3' and covered with a passivation film 2'. The light transmittance T of the element 7' for normal incident light traveling through air 8' is obtained according to the following relation $$T = \frac{4n_2 n^2 n_1}{n^2(n_1 + n_2)^2 - (n^2 - n_1^2)(n_2^2 - n^2)\sin(\delta/2)} \quad (1)$$

where $$\delta = \frac{2\pi n d}{\lambda} \quad (2)$$

$n_1$: refractive index of air
$n$ : refractive index of passivation film
$n_2$ : refractive index of semiconductor substrate
$d$ : thickness of passivation film
$\lambda$ : wavelength of incident light.

Figure 4A:
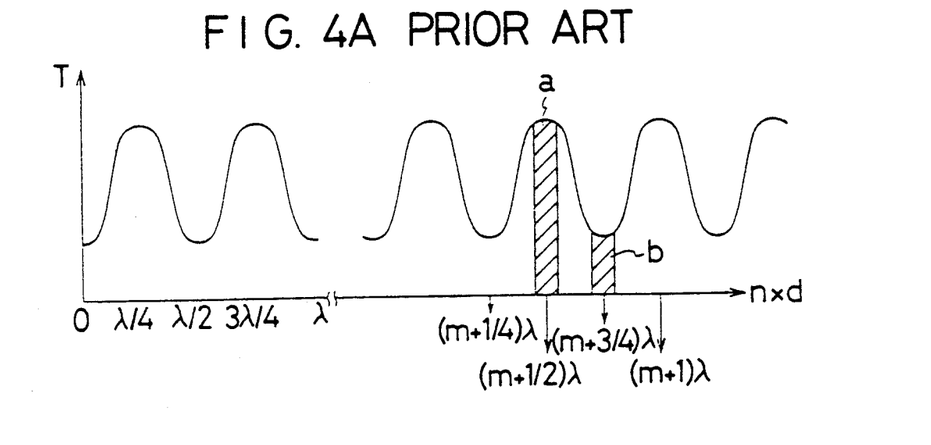
FIG. 4A is a diagram showing the light intensity received by the conventional photo-detecting element.

The light transmittance T has maximum and minimum values when $\delta = (2m+1)\pi$ where m is an integer. FIG. 4A shows the light transmittance T as the function of n.d. Namely, the intensity of light irradiated onto the individual photo-detecting element 7' is varied due to the thickness d of the passivation film 2' and therefore the intensity of the electric signal produced in the individual photo-detecting element 7 is not constant. As shown in FIG. 4A, when the thickness of the passivation film 2' is different between two individual photo-detecting elements formed on the common semiconductor substrate 3', the light transmittance T or the intensity of light irradiated onto the two photo-detecting elements is not equal as indicated by hatched portions a and b.

Stated otherwise, monochromatic incident light is multi-reflected between the opposed major faces of the passivation film and the intensity of the monochromatic light received on the individual photo-detecting element is varied due to the difference of the thickness of the passivation film. In the prior art structure, it is very difficult to form a passivation film of constant thickness over the entire surface of the semiconductor substrate.

SUMMARY OF THE INVENTION

Figure 1A:
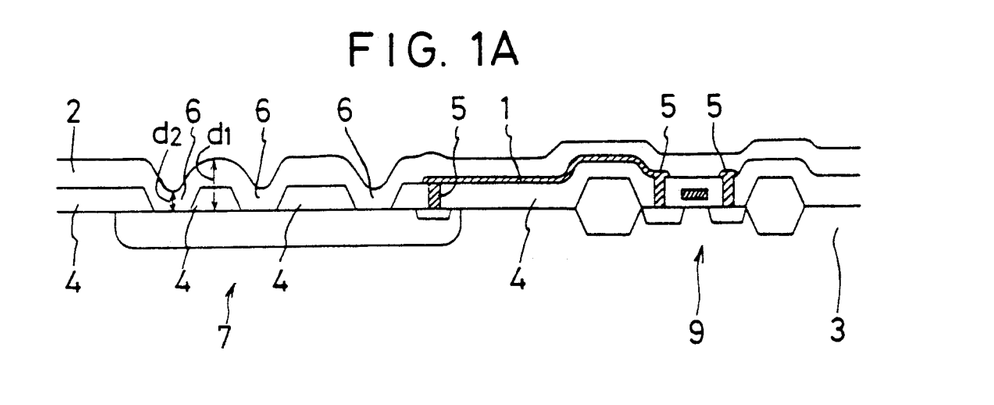
FIG. 1A is a sectional view of a photo-detect semiconductor device according to the present invention.
Figure 4B:
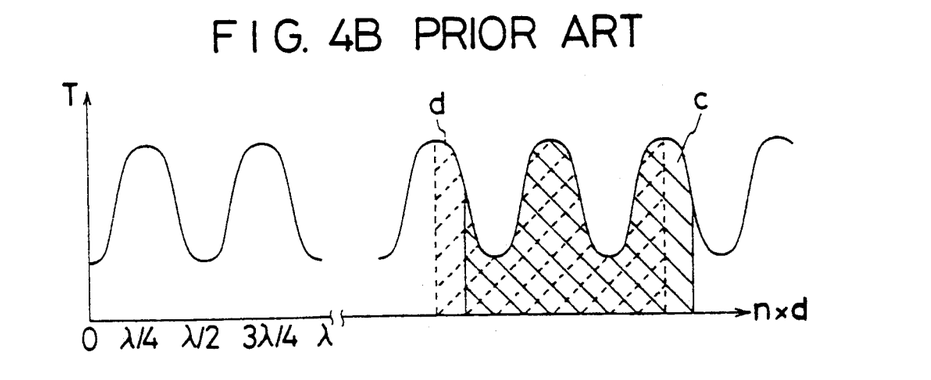
FIG. 4B is a diagram showing the light intensity received by the inventive photo-detecting element.

It is an object of the present invention to eliminate the intensity variation of light irradiated onto the individual photo-detecting elements. According to the present invention, the individual photo-detecting element is covered with a film having an uneven surface to avoid multi-reflection for the monochromatic incident light. As shown in FIG. 4B, when the uneven film has a different mean thickness between two individual photo-detecting elements, the intensity of light irradiated onto the two individual elements through the uneven film is the same as indicated by hatched portions c and d. The uneven film transmits the same intensity of incident light even if the mean thickness of uneven film is not constant over the entire surface of the semiconductor substrate. As shown in FIG. 1A, the uneven film 2 and 4 over one photo-detecting element 7 has a maximum thickness $d_1$ and a minimum thickness $d_2$. The intensity of light received by the element 7 is a total of light components traveling through the thick and thin portions of the uneven film without multi-reflection. Therefore, the intensity of light is constant even if the mean thickness of the uneven film is varied.

DETAILED DESCRIPTION OF THE INVENTION

The invention is explained in detail hereinbelow in conjunction with the drawings. FIG. 1A is a sectional view of one embodiment according to the present invention. A photo-detecting element 7 for photo-electric conversion and a driving element 9 composed of semiconductor integrated circuits are formed on and in a semiconductor substrate 3 of one conductive type. The photo-detecting element 7 and driving element 9 are covered with an inner insulating passivation film 4.

Further, the passivation film 4 is formed with contact holes 6 on the surface of the photo-detecting element 7. The inner passivation film 4 is covered with an outer passivation film 2. The photo-detecting element 7 is connected to the driving element 9 through a lead 1 and contact holes 5.

Figure 1B:
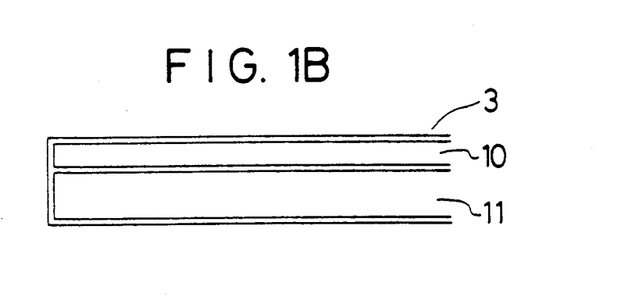
FIG. 1B is a plan view of a photo-detecting semiconductor device according to the present invention.

FIG. 1B is a plan view of the embodiment shown in FIG. 1A. A photo-detecting portion 10 is linearly arranged in the lengthwise direction of the semiconductor substrate 3 and a driving portion 11 for processing electric signals produced in the photo-detecting portion 10 is arranged in parallel to the photo-detecting portion 10. The photo-detecting portion 10 is comprised of a plurality of photo-detecting elements 7, and the driving portion 11 is comprised of a plurality of driving elements 9 corresponding to the respective photo-detecting elements 7.

The photo-detecting semiconductor device is produced as follows. The photo-detecting portion 10 and driving portion 11 are formed on the semiconductor substrate 3 by means of semiconductor device fabrication technology such as thermal oxidation, photo-lithography, ion doping and thermal diffusion. Thereafter, the inner passivation film 4 made of, for example, phospho silicade glass (PSG) is formed on the substrate 3. The passivation film 4 is etched to form therein contact holes 5 and is provided thereon with an electro-conductive thin film made of, for example, Al. The thin Al film is etched by means of photo-lithography to form leads 1. Then, the inner passivation film 4 is selectively etched over the individual photo-detecting elements 7 to form therethrough contact holes 6 therethrough. In the last step of the fabrication process, the photo-detecting elements 7 and driving elements 9 are covered with an outer transparent passivation film 2 made of SiO$_2$, SiN or PSG to protect the elements 7 and 9 against the environment. When the outer and inner passivation films 2 and 4 are made of materials having the same refractive index, the before-mentioned relation (1) can be applied to the calculation of the light transmittance of incident light.

By such a fabrication process, an uneven film composed of the outer and inner passivation films 2 and 4 is formed over the individual photo-detecting element 7. The present invention is not limited to photo-detecting semiconductor devices of the type comprised of the photo-detecting portion 10 and driving portion 11, but also can be applied to those comprised solely of the photo-detecting portion. The photo-detecting elements can be comprised of a photo-diode, a photo-transistor and so on.

According to the present invention, the uneven film can effectively avoid the variation of the transmittance of the incident light to maintain the constant level of electric signal.

Figure 5A:
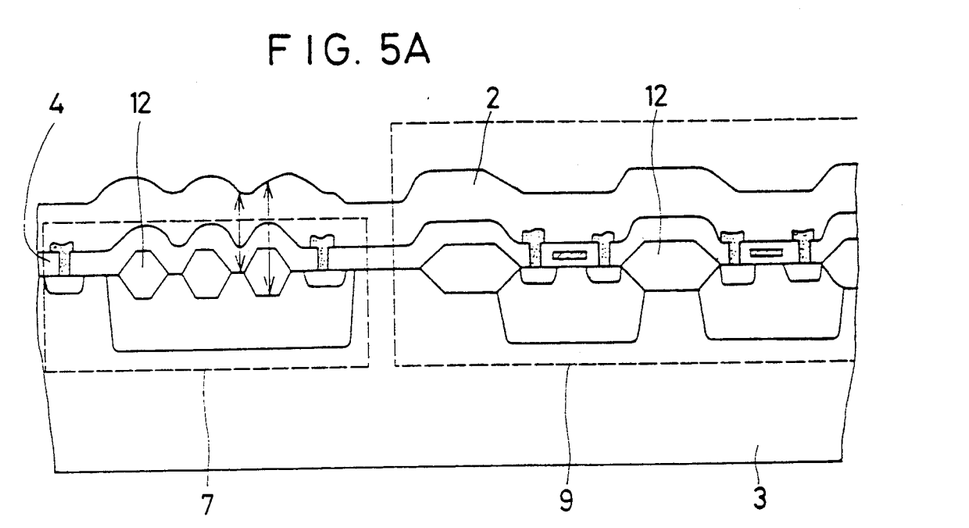
FIGS. 5A and 5B are a sectional view and a plan view of another embodiment of the present invention.
Figure 5B:
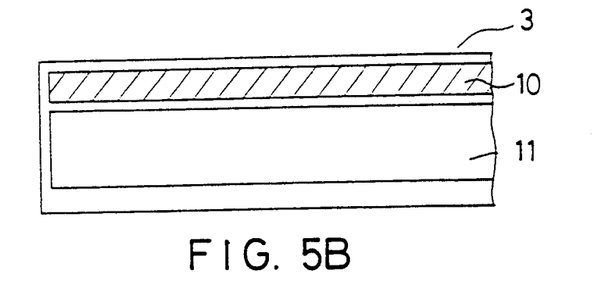

FIG. 5A and 5B show sectional and plan views respectively of another embodiment of the present invention. According to this embodiment, a driving element 9 is formed of complementary metal oxide semiconductor (CMOS) such that a photo-detecting element 7 can be formed on a common semiconductor substrate 3 during the fabrication process of wells of CMOS. Further, an uneven film over the individual photo-detecting element 7 can be formed by means of the local-oxidation-of-silicon (LOCOS) process which can not alter the CMOS fabrication process.

As shown in FIG. 5B, a photo-detecting portion 10 is formed linearly in the lengthwise direction of a semiconductor substrate of one electro-conductive type, and a driving portion 11 for processing electric signals produced in the photo-detecting portion 10 is arranged in parallel to the photo-detecting portion 10. FIG. 5A shows a sectional view taken in the widthwise direction of the semiconductor substrate 3 in which one photo-detecting element 7 and corresponding driving element 9 are illustrated.

This photo-detecting semiconductor device is fabricated according to the process applied to CMOS fabrication. The driving portion 11 is formed on the semiconductor substrate 3 of a single crystal and one electro-conductive type by means of semiconductor fabrication technology such as thermal oxidation, photo-lithography, ion doping and thermal diffusion. At this time, the photo-detecting portion 10 can be formed during the formation of wells of CMOS. Further, LOCOS regions 12 which are formed by the LOCOS process are provided in the CMOS driving element 9 to separate various regions of CMOS driving element 9. At the same time, other LOCOS regions 12 are provided on the photo-detecting element 7 to form thereon unevenness. In the final step, the photo-detecting element 7 and driving element 9 are covered with inner and outer transparent passivation films 4 and 2 made of, for example, SiO$_2$, SiN or PSG to protect the elements 7 and 9 against the environment. By such process applied to CMOS, an uneven film composed of the LOCOS regions 12 and the inner and outer passivation films 4 and 2 is formed on the photo-detecting element 7.

Figure 6:
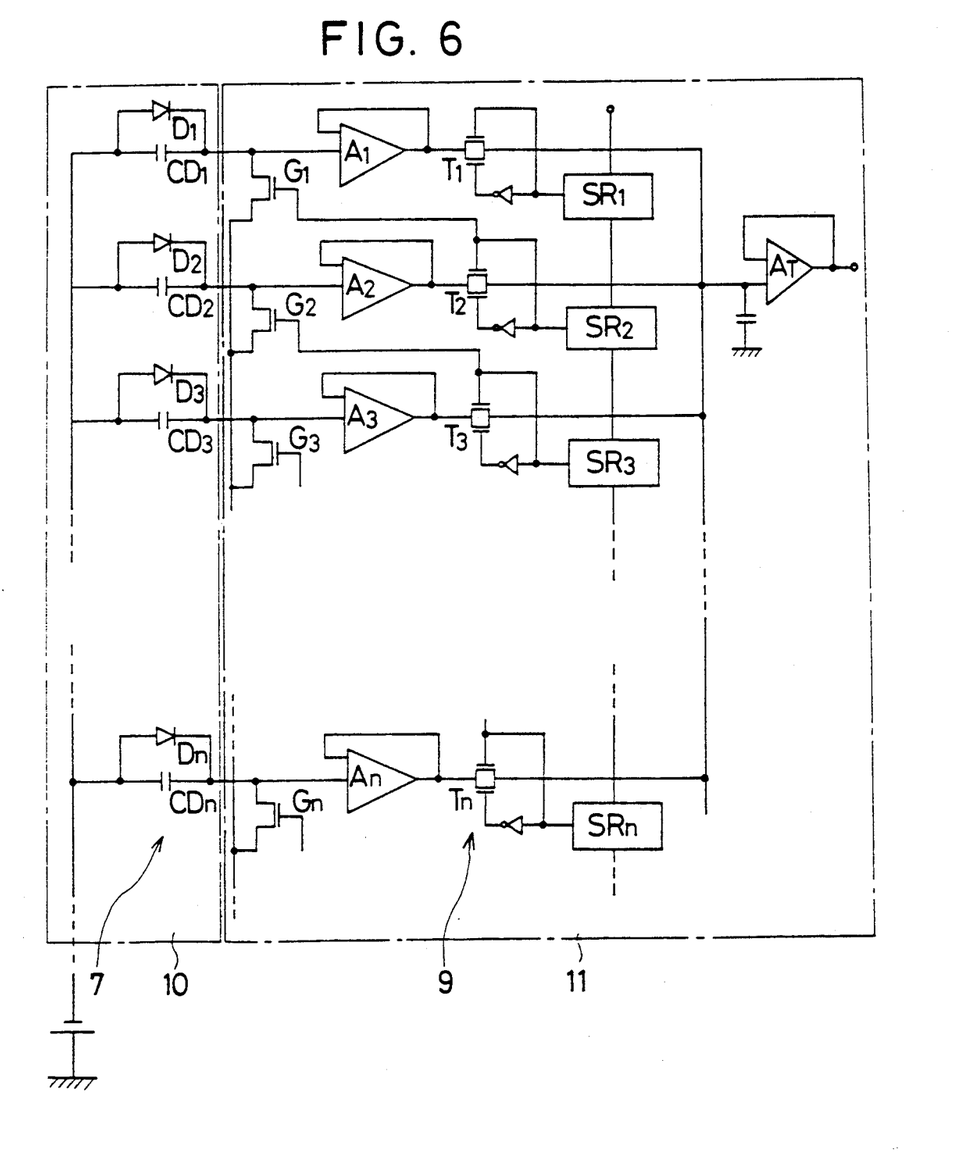
FIG. 6 is a circuit diagram of the embodiment shown in FIGS. 5A and 5B.

FIG. 6 shows an equivalent circuit diagram of the photo-detecting portion 10 and driving portion 11. The individual photo-detecting element 7 is represented by a photo-diode Dn and a capacitor CDn. The individual driving element 9 is comprised of a CMOS transistor Gn for discharging the capacitor CDn and an amplifier An connected to the corresponding individual photo-detecting element 7 for amplifying the electric signal from the element 7. The amplified signal is outputted through a transmission gate Tn when the gate Tn is made open in response to a control signal from a shift register SRn. The transistor Gn, amplifier An and transmission gate Tn are formed by the CMOS process. Further, the photo-diode Dn can be replaced by a photo-transistor.

According to the present invention, the photo-detecting element is covered with the transparent uneven film effective to maintain the intensity of incident light irradiated onto the photo-detecting element even if the mean thickness of the passivation films are not uniform over the entire surface of the semiconductor substrate. Further, the CMOS process can be applied to form the photo-detecting elements and driving elements on the common substrate at the same time.

Figure 7:
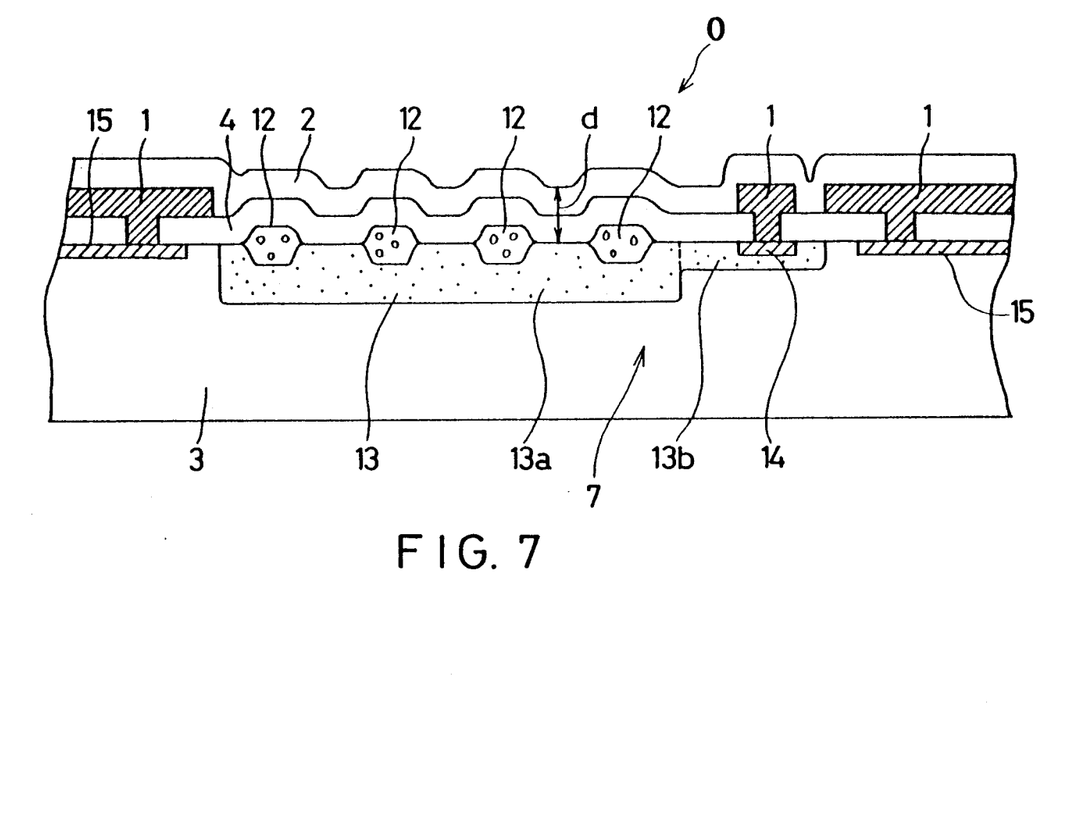
FIG. 7 is a sectional view of further embodiment of the present invention.

FIG. 7 shows a further embodiment of the photo-detecting semiconductor device or image sensor. The image sensor 0 is comprised of a plurality of photo-detecting elements 7 formed on an n$^-$ type semiconductor substrate 3. In FIG. 7, only one element 7 is illustrated. In the drawing, a p-well 13 is formed on the substrate 3 to operate as a base region. The p-well 13 is selectively diffused within the n$^-$ type substrate 3 and comprised of a first deep diffusion region 13a operating as a light receiving portion and a second shallow diffusion region 13b operating as a base region of a transistor of high amplification rate. A plurality of LOCOS oxide film regions 12 are formed on the surface of the first region 13a. In the embodiment shown in the drawings, the LOCOS oxide regions 12 are dots and arranged in rows and columns at a given interval.

In FIG. 7, an n+ type emitter region 14 is formed within the second region 13b and n+ type collector region 15 is formed on the n− type substrate 3.

The emitter region, base region and collector region are covered with inner and outer passivation films 4 and 2 made of, for example, $SiO_2$ and SiN. Leads 1 made of aluminum are formed on the inner passivation film 4 and connected between the emitter region 14 and collector region 15.

According to such structure, the surface of the first region 13a is made uneven regularly by means of the LOCOS oxide regions 12 such that the inner and outer passivation films 4 and 2 formed on the LOCOS oxide regions 12 are also made uneven along the LOCOS region 12. Consequently, the distance d between the surface of the first region 13a and the outer surface of the outer passivation film 2 is varied to reduce the effect of the multi-reflection of incident light within the outer and inner passivation films 4 and 2 and the LOCOS oxide regions 12. Therefore, the output fluctuation of the image sensor between the leads 1 of emitter and collector regions 14 and 15 is reduced to thereby offer an image sensor having a constant output characteristic.

Moreover, according to the present invention, the LOCOS oxide regions 12 are formed on the first region 13a to make unevenness on the first region 13a. This formation of the LOCOS oxide regions can be carried out during the step of separating logic elements. Therefore, in the most cases, an additional separate step of forming the LOCOS regions is not needed to thereby reduce the production cost.

Figure 8A:
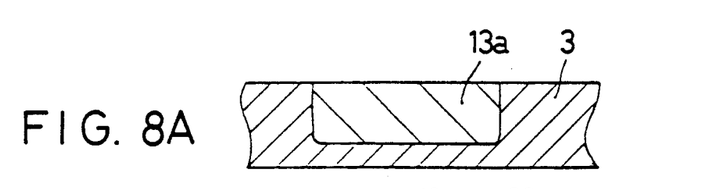
FIGS. 8A, 8B, 8C and 8D are diagrams explaining the method of making the embodiment shown in FIG. 7.
Figure 8B:
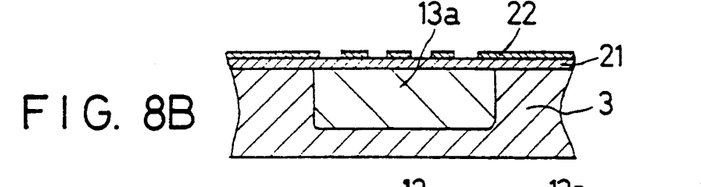
Figure 8C:
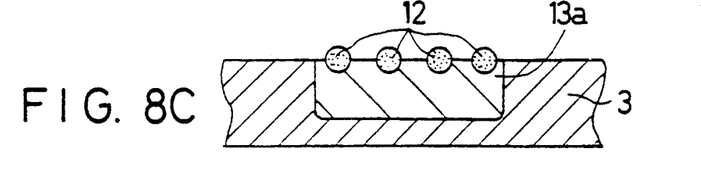
Figure 8D:
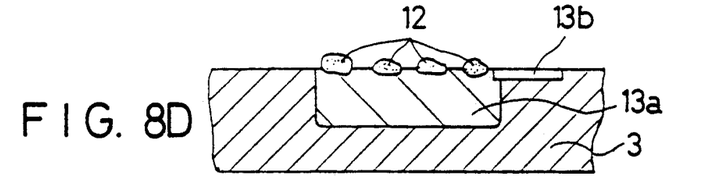

FIGS. 8A through 8D show steps of forming the LOCOS oxide regions 12. Firstly, the first region 13a of the p-well 13 is formed within the n− type substrate 3 by patterning (FIG. 8A). Then the silicon oxide film 21 and silicon nitride (SiN) film 22 are formed on the n− type substrate 3 and only the silicon nitride film 22 is patterned to form windows for the formation of the LOCOS oxide regions (FIG. 8B). Thereafter, the substrate 3 is stored within oxygen gas such that oxygen is doped locally into the p-well through the windows to form the LOCOS oxide regions 12 on the first region 13a, and then the silicon nitride film 22 and silicon oxide film 21 are removed (FIG. 8C). Lastly, the second region 13b is formed adjacent to the first region 13a by the shallow diffusion process (FIG. 8D). The following steps are omitted because they are similar to the conventional steps.

As shown in FIG. 8D, the shallow second region 13b is formed adjacent to the deep first region 13a and the emitter region 14 is formed within this second region 13b so that the amplification factor $h_{fe}$ of the photo-transistor is great. Therefore, it is possible to avoid reduction of the image sensor output level even when the diffusion or junction depth of the first region 13a is made great due to the addition of the LOCOS oxide regions 12.

Further, in the above described embodiment, the LOCOS oxide region 12 has a dot shape. However, the present invention is not limited to the dot shape, but strip shape and other shapes can be adopted. It is well understood from the above description that any shape could be used to vary the distance d between the surface of the base region which receives the incident light and the outer surface of the passivation film.

Figure 9:
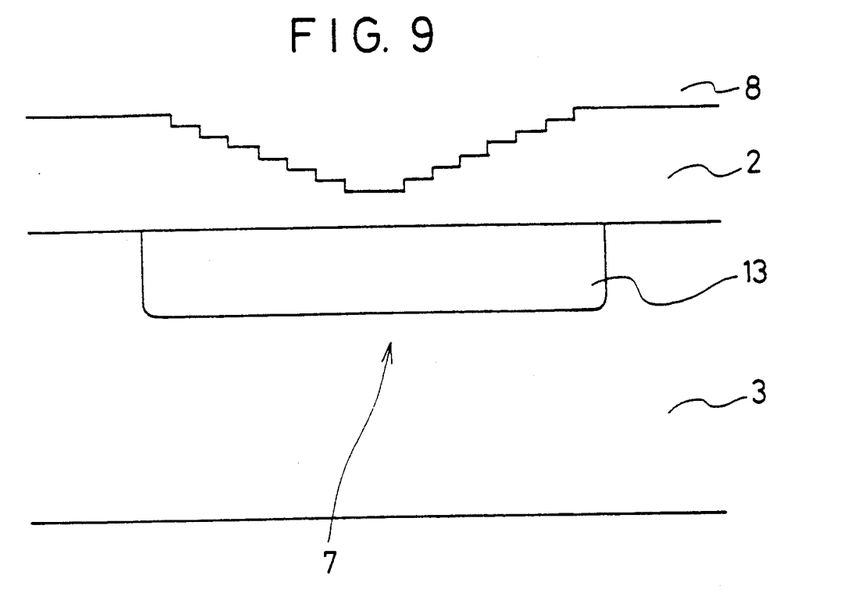
FIG. 9 is a sectional view of still further embodiment of the present invention.
Figure 10:
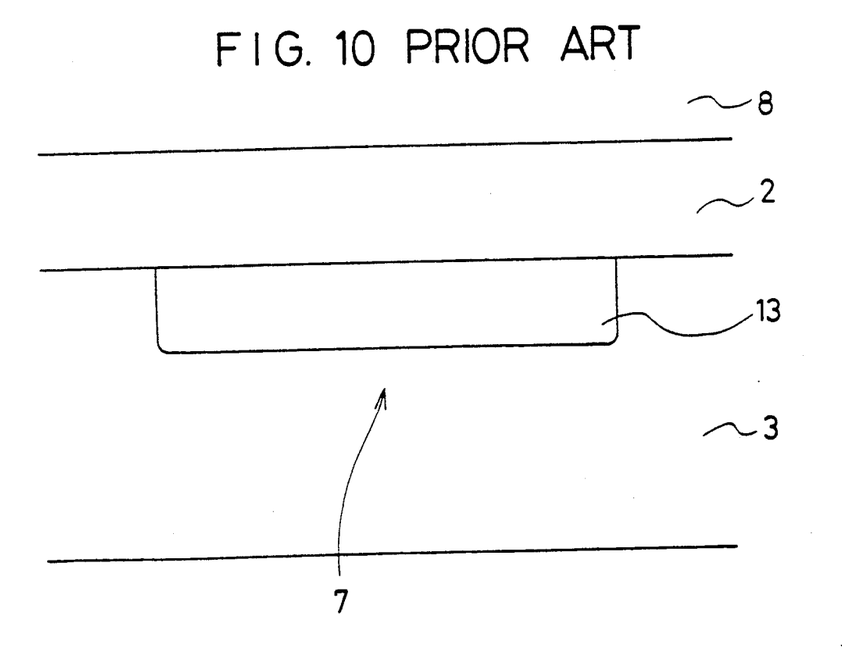
FIG. 10 is a sectional view of a conventional photo-detecting element.

FIG. 9 show a further embodiment of the present invention. A doped region 13 of one electro-conductive type is formed within a semiconductor substrate 3 of opposite electro-conductive type to form along the boundary between the region 13 and substrate 3 a pn junction to constitute a photo-detecting element 7. The doped region 13 is covered with a passivation film 2 having a stepwisely changing thickness. The number of steps formed in the passivation film 2 can be increased to improve the stability of electric signal produced in the photo-detecting element 7. The passivation film 2 having the different thickness over the doped region 13 can effectively maintain the intensity of light irradiated onto the pn junction at a constant level even if the mean thickness of the passivation film 2 is changed as compared to a passivation film 2 of a uniform thickness as shown in FIG. 10.

What is claimed is:

1. An image sensor comprising:
a photo-detecting element having a receiving surface receptive of incident light for effecting photo-electric conversion;
at least one insulating passivation film having an exposed surface and being disposed on the photo-detecting element; and
a plurality of LOCOS oxide regions interposed between the insulating passivation film and the photo-detecting element such that the vertical distance between the exposed surface and the receiving surface is varied so as to suppress multi-reflection of the incident light therebetween over the receiving surface.

2. An image sensor according to claim 1, wherein the photo-detecting element comprises a base region with the LOCOS oxide regions formed thereon and having a relatively great junction depth, and an emitter region formed adjacent to the base region and having a relatively small junction depth.

3. An image sensor comprising: means defining at least one photodetecting element having a receiving surface receptive of light for effecting a photo-electric conversion; means defining an insulating passivation layer over the receiving surface and having an exposed surface of given area through which the light passes to the receiving surface; and means defining a plurality of LOCOS oxide regions between the at least one photo-detecting element and the passivation layer such that the vertical distance between the exposed surface and the receiving surface is non-constant throughout the given area to effect a suppression of multi-reflection of incident light over the receiving surface and between the receiving surface and the exposed surface.

4. An image sensor according to claim 3, wherein each photo-detecting element comprises a base region with the LOCOS oxide regions formed thereon and having a relatively great junction depth, and an emitter region formed adjacent to the base region and having a relatively small junction depth.

* * * * *